(12) United States Patent
Yu et al.

(10) Patent No.: US 6,204,205 B1
(45) Date of Patent: Mar. 20, 2001

(54) USING $H_2$ ANNEAL TO IMPROVE THE ELECTRICAL CHARACTERISTICS OF GATE OXIDE

(75) Inventors: Mo-Chiun Yu, Taipei; Syun-Ming Jang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/347,911

(22) Filed: Jul. 6, 1999

(51) Int. Cl.$^7$ ................................................. H01L 21/469
(52) U.S. Cl. ........................................... 438/787; 438/770
(58) Field of Search .................................... 438/770, 787

(56) References Cited

U.S. PATENT DOCUMENTS

| | | | |
|---|---|---|---|
| 5,210,056 | 5/1993 | Pong et al. ............................ | 437/239 |
| 5,538,923 | 7/1996 | Gardner et al. ....................... | 437/238 |
| 5,620,932 * | 4/1997 | Fujimaki et al. ..................... | 438/770 |
| 5,646,074 | 7/1997 | Chen et al. ........................... | 437/239 |
| 5,811,334 | 9/1998 | Buller et al. ......................... | 438/264 |
| 5,851,888 | 12/1998 | Gardner et al. ...................... | 438/301 |
| 5,851,892 * | 12/1998 | Lojek et al. .......................... | 438/305 |

OTHER PUBLICATIONS

Wolf et al., "Silicon Processing for the VLSI Era", Lattice Press, Sunset Beach, CA. , vol. 1: Process Technology, (1986), p. 209.

* cited by examiner

*Primary Examiner*—John F. Niebling
*Assistant Examiner*—Alexander G. Ghyka
(74) *Attorney, Agent, or Firm*—George O. Saile; Stephen B. Ackerman

(57) ABSTRACT

A new method is provided to anneal the gate oxide after the gate oxide has been grown. The first embodiment of the invention teaches a two step anneal, a first anneal using $H_2$ followed by a second anneal using $N_2$. The second embodiment of the invention teaches a one step anneal using $H_2$ mixed with $N_2$. The third embodiment of the invention teaches a one step anneal using pure $H_2$.

8 Claims, 2 Drawing Sheets

USING H₂ ANNEAL TO IMPROVE THE ELECTRICAL CHARACTERISTICS OF GATE OXIDE

BACKGROUND OF THE INVENTION (1) Field of the Invention

The invention relates to the fabrication of integrated circuit devices, and more particularly, to a two step method for annealing gate oxide.

(2) Description of the Prior Art

The formation of semiconductor devices typically starts with a bare wafer that is divided into a plurality of active regions and isolation regions. The isolation regions can be formed using such techniques as the growing of layers of Field Oxide (FOX) or by electrically isolating active regions by means of Shallow Trench Isolation (STI) regions. To provide stress relieve, a thin (15–100 um. thick) layer of oxide is thermally grown or CVD deposited over the upper surface of the substrate in the active areas. For the creation of MOS devices, a gate electrode is created, the layer of oxide under the gate forms the gate oxide. The gate electrode is then grown by the deposition, patterning and etching of a layer of polysilicon in the active region of the device. Lightly Doped Drain regions can be created immediately adjacent to the gate electrode, gate spacers are formed on the sides of the electrode. An implant can next be performed to introduce an impurity distribution in the source/drain regions of the gate electrode. Electrical contact is established as a final step with the source/drain regions and the top surface of the gate electrode.

As part of the preceding procedure, threshold voltage performance can be improved by a channel implant (of for instance boron concentrations of between about $10^{12}$–$10^{13}$ atoms/cm² implanted with an energy of between about 50 and 100 keV), this after the layer of gate oxide has been created. The (boron) ions will penetrate the layer of gate oxide but will not penetrate the FOX layer for the isolation region and will form an electrical barrier between the source and the drain regions.

The growth of the gate oxide is a very critical step in the creation of the gate electrode. Proper device operation requires a layer of high quality oxide without contamination since even minor amount of impurities in the gate oxide may result in impaired breakdown and reliability of the gate electrode. Basic principles of operation of the gate electrode teach that the drain current of a MOS transistor is inversely proportional to the thickness of the gate oxide. Increased drain current results in improved (faster) device operation that imposes the requirement that the gate oxide must be as thin as possible. Device refresh cycle time is improved by thinner gate oxide. Before the gate oxide layer is deposited, the surface over which the layer is to be deposited must be made free of any contaminants or of any residual oxide. The substrate surface on which the gate oxide is created is therefore wet-etched to remove any residuals. As a further preparation of the surface on which the gate oxide is to be created, a sacrificial layer of oxide can first be grown, this layer of sacrificial oxide removes any dry-etch induced damage or unwanted nitride. This layer of sacrificial oxide is removed after which the layer of gate oxide is grown under extreme conditions of control, typically through dry oxidation in chlorine ambient. The main parameter in the growth of this high quality layer of oxide is the time required for the growth process, only through making this process a very slow process with a low growth rate can reasonable oxide be obtained.

With decreased gate electrode dimensions, device limitations imposed by these reduced dimensions must be removed. Short channel effects are removed by reduced junction depth for the source/drain regions and by reducing the thickness of the gate oxide. Extreme reduction of the gate oxide thickness, to for instance 50 Angstrom or even less, results in increased impact of electrically active impurities and to the diffusion of these impurities from the gate structure across the gate oxide into the active regions of the device. These impurities may, with a thinner gate oxide layer, also more readily migrate into the channel region of the transistor and affect the threshold voltage, a problem that is especially acute for boron or $BF_2$ implanted devices (since boron/$BF_2$ are P⁺dopants). Decreased thickness of the gate oxide further causes increased electric field density and strength across the oxide to substrate interface causing concerns about oxide breakdown. This increased electric field strength can reach across the interface into the device channel region further raising concerns about hot carrier damage.

S. Wolf, Silicon Processing for the VSLI Era, Vol. 1, pg. 209 e.a. teaches that various techniques have been used to achieve reduced growth rate of thin oxide, such as dry oxidation, dry oxidation with HCl, trichloroethylene, TCE or trichloroethane, reduced pressure oxidation, a low temperature/high pressure oxidation and a rapid thermal processing under oxidation conditions. As examples are cited the growth of thin (less than 200 Angstrom) oxides in dry $O_2$ at a temperature between about 780 and 980 degrees C. Specifically, a 100 Angstrom thick layer of oxide can be grown in this manner during a time of 30 minutes and at a temperature of 893 degrees C. Another example cited is the growth of thin oxide using LPCVD at reduced pressure of 0.25 to 2 Torr and a temperature of about 900 to 1000 degrees C. The reduction on pressure results in improved thickness control.

U.S. Pat. No. 5,811,334 teaches techniques for the cleaning procedures in preparation of the deposition of the oxide layer. One such procedure is a two step procedure; the first step designed to remove organic contaminants such as residual photoresist, the second step to remove trace metal particles and ionic contaminants. The first step generally requires immersing the wafer in a 70 to 85 degrees C. solution of $H_2O$—$NH_4OH$—$H_2O_2$; the second step generally comprises immersing the wafer in a 75 to 85 degrees C. solution of $H_2O$—HCl—$H_2O_2$. This process however has the disadvantage of roughing the substrate surface, which results in the deposition of lower quality oxides.

Irregularities in the thermal oxide layer may also result from irregularities on the substrate surface such as precipitates, dislocation, faults, defects, contaminants and improper bonds. These irregularities cause improper growth of the oxide layer on the substrate surface, this effect may be further aggravated if the substrate irregularities are the cause of irregular growth ("trap sites") of the oxide layer in the vicinity of the underlying disturbances. This can for instance result in local oxide thinning while trap sites may play the role of binding charged ions thereby further disrupting regular growth and deposition of the oxide. Charges accumulate in localized trap sites when the transistor is biased causing electrical breakdown of the oxide in the vicinity of the trap sites and thus affecting the threshold voltage of the oxide layer. The conventional anneal step is implemented to, as much as possible, negate the indicated negative affect by, among others, eliminating trap sites and other irregularities. Anneal can consist of a double anneal cycle. The first anneal cycle improves the surface of the silicon substrate and makes it better suited for the deposition of a high quality layer of oxide. The second anneal is more aimed at improving the quality of the created layer of oxide by removing irregularities or trap sites inside the oxide layer. The process of creating a layer of oxide may therefore by broken down in a pre-oxidation anneal and a post-oxidation anneal, both cycles of annealing to be performed under carefully controlled processing conditions of temperature, pressure, gas flow, etc.

In a typical thermal oxidation method, the substrate is thermally oxidized to form the substrate oxide film. The substrate is placed inside a quartz tube in a vertical or horizontal type heat treatment furnace. An oxidizing source such as oxygen with water vapor is fed into the quartz tube while the wafer is heated to about 1000 degrees C. The oxide layer formed is this manner is then further subjected to an annealing process, this typically in a dry ambient gas. Immediately after the annealing process, many dangling bonds are assumed to be present in the interface between the oxide film and the surface of the substrate. These dangling bonds are considered to be unstable states and the cause of increased surface recombinations, thus reducing the wafer lifetime. Other methods of forming oxidation layers are electromechanical anode oxidation and plasma reaction. The above-indicated method of thermal oxidation is an example of a wet oxidation method. Wet oxidation can also use vaporized $H_2O$ as the oxidation medium. Dry oxidation methods use $O_2$ and HCl gases to form the oxide layer. The dry oxidation method is the preferred method to form gate oxide layers since this method can better control the formation of a thin film and can obtain a high quality oxide.

Thinner oxide layers are increasingly affected by oxide layer breakdown phenomenon such as lattice defects caused by particles, carbon participates, stacking faults, metallic combinations and the contamination of the oxide film.

During the formation of an oxide layer on the surface of a substrate, the interface between the silicon and the oxide film extends into the surface of the substrate. This is because the oxygen atoms oxidize the silicon atoms. Approximately 44% of the overall oxide film penetrates below the surface of the substrate. Contaminants on the surface of the substrate, such as metal ions and natrium ions, penetrate the oxide film on the surface of the substrate thereby creating a new distribution and profile of the energy level within the oxide film. This shifting in electrical energy within the oxide layer has a deteriorating effect on the oxide layer (and therefore the device) reliability and its electrical characteristics.

The post-oxidation annealing process is applied to reduce the fixed charges in the formed oxide layer. Fixed charge density can for instance be reduced by annealing in nitrogen or argon at atmospheric pressure using a hot-wall annealing furnace at temperatures of about 900 degrees C. High temperature annealing however adversely affects the insulating and dielectric characteristics of oxide layer over extended periods of time. This effect has been connected with the thermal decomposition of oxide on silicon surfaces at elevated temperatures. Oxide decomposition can take the form of the generation of a volatile product, silicon monoxide (SiO) creating atomic voids in the oxide layer thereby affecting layer reliability and performance. The oxide layer may cease to be able to sustain the electric field that is required for proper device operation and will, as a consequence, fail to operate or fail prematurely.

U.S. Pat. No. 5,811,334 (Buller et al.) shows an $H_2$ anneal of an oxide layer, see col. 4, lines 41–44.

U.S. Pat. No. 5,851,888 (Gardner et al.), U.S. Pat. No. 5,210,056 (Pong et al.) and U.S. Pat. No. 5,851,892 (Lojek et al.) show $N_2$ anneals for a gate oxide.

U.S. Pat. No. 5,646,074 (Chen et al.) teaches a $O_2$ anneal for a gate oxide.

U.S. Pat. No. 5,620,932 (Fujimaki) discloses a low temperature $H_2$ anneal of an oxide layer.

U.S. Pat. No. 5,538,923 (Gardner) shows an $N_2$ anneal.

SUMMARY OF THE INVENTION

A principle objective of the invention is to improve the Gate Oxide Integrity (GOI) of the gate oxide.

Another objective of the invention is to improve breakdown-voltage ($V_{bd}$) performance of the gate oxide.

Yet another objective of the invention is to improve accumulated-charge-for-breakdown ($Q_{bd}$) performance of the gate oxide.

In accordance with the objectives of the invention a new method is provided to anneal the gate oxide after the gate oxide has been grown. Prior Art anneal teaches a one step $N_2$/Ar anneal after the gate oxide has been created.

The first embodiment of the invention teaches a two step anneal process (after the gate oxide has been created), the first step is a $H_2$ gas anneal while the second step is a $N_2$ gas anneal.

The second embodiment of the invention teaches a one step anneal process (after the gate oxide has been created) using a $H_2$ gas together with a $N_2$ gas for the anneal.

The third embodiment of the invention teaches a one step anneal process (after the gate oxide has been created) using pure $H_2$ gas for the anneal.

It has been shown that a $H_2$ anneal will not attack the thermal gate oxide layer, even though it is known that $H_2$ anneal does attack native oxide.

DESCRIPTION OF THE PREFERRED EMBODIMENTS

Figure 1:
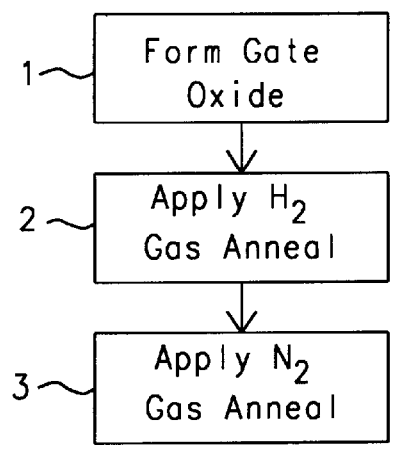
FIG. 1 shows the gate oxide creation and anneal of the first embodiment of the invention.

Referring now specifically to FIG. 1, there are shown the three steps under the first embodiment of the invention of creating and annealing a layer of gate oxide, as follows:

FIG. 1 step 1 indicates the creation of the layer of gate oxide. Gate oxide is usually formed as a silicon dioxide material but may be a composite oxide, such as TEOS and silicon dioxide, or a nitride oxide layer or a like gate dielectric. Gate oxide is typically grown at a temperature of 750 to 900 degrees C. and to a thickness of 60 to 160 Angstrom. The invention addresses gate oxide layers that are considerably thinner with a thickness of between about 10 and 15 Angstrom.

FIG. 1, step 2 indicates the application of the first anneal under the first embodiment of the invention using $H_2$ gas. This anneal process is performed under atmospheric pressure, at a temperature between about 800 and 1200 degrees C. for a duration of between about 20 and 40 seconds.

FIG. 1, step 3 indicates the application of the second anneal under the first embodiment of the invention using $N_2$ gas. This anneal process is performed under atmospheric pressure, at a temperature between about 800 and 1200 degrees C. for a duration of between about 20 and 40 seconds.

Figure 2:
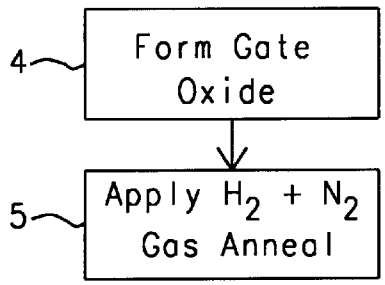
FIG. 2 shows the gate oxide creation and anneal of the second embodiment of the invention.

FIG. 2 refers to the gate oxide creation and annealing under the second embodiment of the invention. Step 4 indicates the creation of the gate oxide under conditions as indicated previously under the first embodiment of the invention. Step 5 indicates the anneal process of the second embodiment of the invention, that is an anneal using a mixture of $H_2$ and $N_2$ as the gas for the anneal. These two gasses are mixed in approximately equal proportions, that is 50% $H_2$ and 50% $N_2$. The processing conditions during the anneal process are identical to the processing conditions indicated previously for the first embodiment of the invention, that is this anneal process is performed under atmospheric pressure, at a temperature between about 850 and 1100 degrees C. for a duration of between about 30 and 90 seconds.

Figure 3:
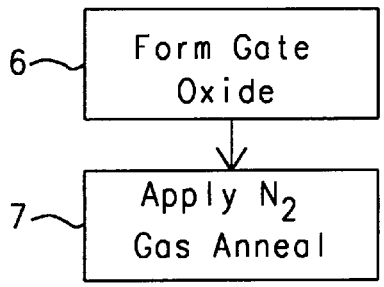
FIG. 3 shows the gate oxide creation and anneal of the third embodiment of the invention.

FIG. 3 addresses the creation and annealing of the gate oxide layer under the third embodiment of the invention. Step 6 indicates the creation of the gate oxide under conditions as indicated previously under the first and second embodiment of the invention. Step 7 indicates the anneal process of the third embodiment of the invention, that is an anneal using pure $H_2$ as the gas for the anneal. The processing conditions during the anneal process are identical to the processing conditions indicated previously for the first and second embodiment of the invention, that is this anneal process is performed under atmospheric pressure, at a temperature between about 850 and 1100 degrees C. for a duration of between about 30 and 90 seconds.

Experimental data have been obtained that confirm that the $H_2$ anneal does not attack the thermal gate oxide. The thickness of the gate oxide has been measured before and after applying a pure $H_2$ anneal, these measurements are shown below where column #1 shows the thickness of the original layer of gate oxide, column #2 shows the thickness of the gate oxide after the application of a $H_2$ anneal while column #3 shows the processing conditions under which the anneal has been performed. The data have been obtained for two different anneal temperatures as indicated in column #3.

| Col. #1 | Col. #2 | Col. #3 |
| --- | --- | --- |
| 14.66 | 14.079 | 900° C./60 sec. |
| 14.517 | 14.084 | 1000° C./60 sec. |

It is clear from these results that the $H_2$ anneal does not to any appreciable degree affect the thickness of the original layer of gate oxide.

Figure 4:
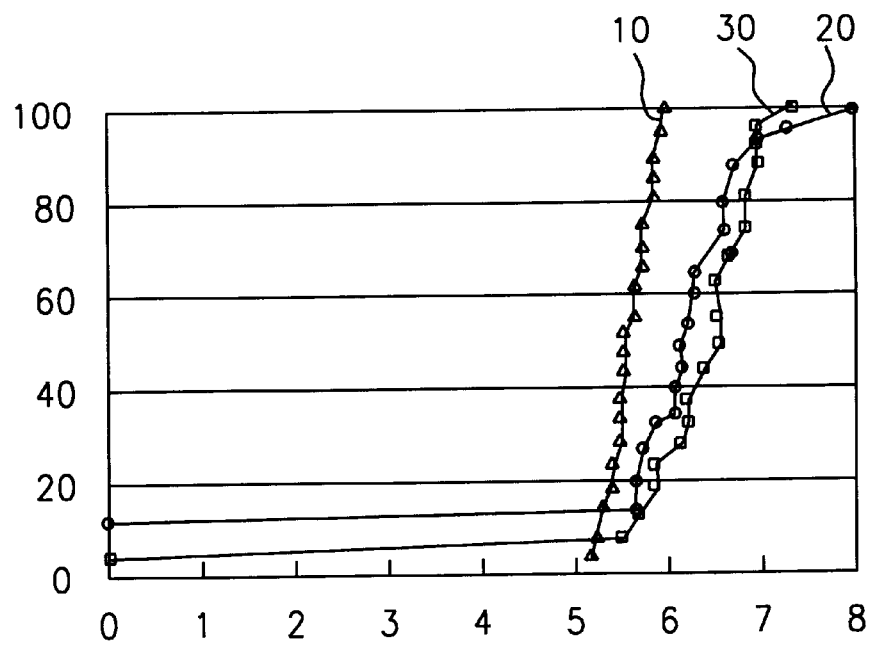
FIG. 4 shows a graph comparing the $V_{bd}$ performance of the gate oxide under conditions of no anneal, a $N_2$ anneal and a $H_2$ followed by a $N_2$ anneal.

FIG. 4 shows a graph comparing the $V_{bd}$ performance of the gate oxide under conditions of no anneal, a $N_2$ anneal and a $H_2$ followed by a $N_2$ anneal. FIG. 4 contains a total of three graphic depictions. FIG. 4 graph 10 shows the cumulative $V_{bd}$ performance for a gate oxide layer of 32 Angstrom thick that has not undergone any anneal treatment. The cumulative value (in %) is represented by the values along the Y-axis, the value for $V_{bd}$ (in volts) is represented by the values along the X-axis. Graph 10 indicates that the breakdown voltage remains constant around five volts or, in other words, does not show any improvement. This is to be expected since graph 10 represents a layer of thermal gate oxide to which no anneal process has been applied.

FIG. 4 graph 20 represents a gate oxide layer of 32 Angstrom thickness to which a $N_2$ anneal has been applied, that is the Prior Art anneal process. Graph 30 indicates that, after a cumulative value of about fifteen has been reached, the $V_{bd}$ increases with increasing cumulative values. This indicates, as is to be expected, an improvement in the $V_{bd}$ performance for the gate oxide layer to which the (Prior Art) $N_2$ anneal has been applied. The anneal conditions under which graph has been measured are as follows: $N_2$ anneal at 1050 degrees for a time of 30 seconds.

FIG. 4 graph 30 represents a gate oxide layer of 32 Angstrom thickness to which a $H_2$ anneal followed by a $N_2$ anneal has been applied, that is the first embodiment of the invention. Graph 30 indicates that, after a cumulative value of about ten has been reached, the $V_{bd}$ increases with increasing cumulative values. This increase, when compared with the $V_{bd}$ performance of curve 20 (the Prior Art), is more pronounced (graph 30 is for most of the cumulative values, to the right of graph 20) indicating that the anneal process of the invention further improves the $V_{bd}$ performance of the gate oxide. The anneal conditions under which graph has been measured are as follows: $H_2$ anneal at 1050 degrees C. for a time of 30 seconds, $N_2$ anneal at 1050 degrees for a time of 30 seconds. The Y-axis parameter is the cumulative percentage breakdown voltage parameter. The absolute value of the breakdown voltage as shown in graph 30, FIG. 4, is slightly higher than the breakdown voltage shown in graph 20 reflecting a slight improvement in the breakdown voltage value of the gate oxide layer. The size of the test chip that has been used for the measurement presented in FIG. 4 is 0.04 $cm^2$.

Figure 5:
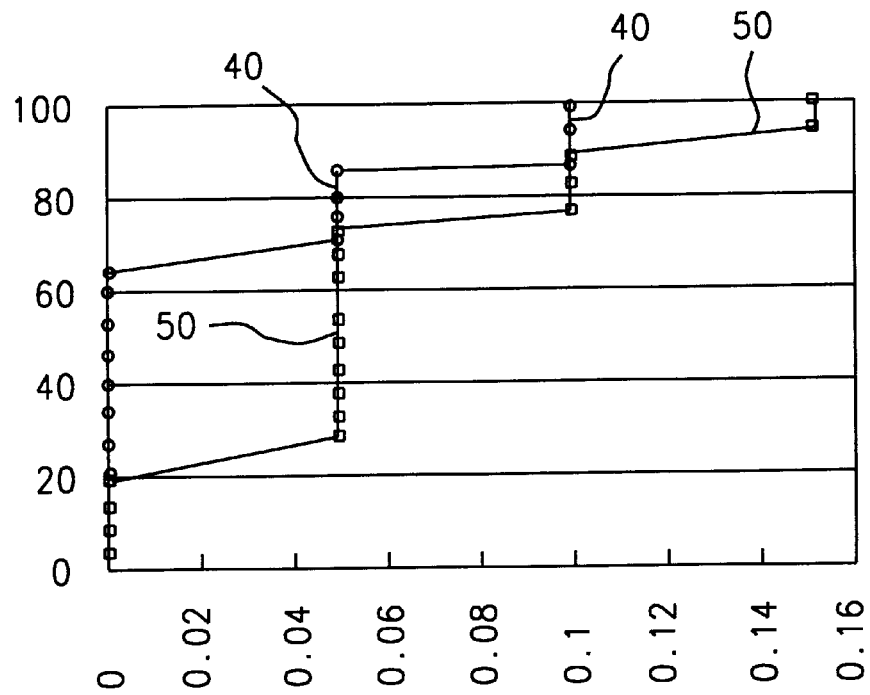
FIG. 5 shows a graph comparing the $Q_{bd}$ performance of the gate oxide under conditions of a $N_2$ anneal and a $H_2$ followed by a $N_2$ anneal.

FIG. 5 shows two graphs comparing the $Q_{bd}$ performance of the gate oxide under conditions of a (Prior Art) $N_2$ anneal and a (first embodiment of the invention) $H_2$ anneal followed by a $N_2$ anneal. The Y-axis represents the cumulative failures for $Q_{bd}$ of the measured gate oxide layer, the X-axis represents the value for Qbd at which this failure occurred.

FIG. 5 graph 40 shows relation between the cumulative (Y-axis) and the $Q_{bd}$ (X-axis) values of the thermal gate oxide under Prior Art conditions of anneal, that is using only a $N_2$ anneal. The cumulative failures of the gate oxide layer occur at about 0.05 $C/cm^2$, these cumulative failures are considerably higher than the cumulative failures as shown by graph 50 which represents the Qbd failures of the gate oxide for a oxide layer that has been annealed in accordance with the first embodiment of the invention. The (Prior Art) anneal conditions under which graph 40 has been measured are as follows: $N^2$ anneal at 1050 degrees for a time of 30 seconds.

FIG. 5 graph 50 represents a gate oxide layer that has first been annealed in accordance with the first embodiment of the invention, that is a first anneal using a $H_2$ gas after which a second anneal using a $N_2$ gas. The anneal conditions under which graph has been measured are as follows: $H_2$ anneal at 900 degrees C. for a time of 30 seconds, $N_2$ anneal at 1050 degrees for a time of 30 seconds. The absolute value of graph 50, FIG. 5, is larger than the absolute value of graph 40 indicating an improvement in the gate oxide layer characteristics. A test current density of 0.05 $A/cm^2$ was used for the graphs shown in FIG. 5, the test area size was 0.01 $cm^2$.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a high quality oxide on the surface of a semiconductor substrate, comprising the steps of:

providing a semiconductor substrate having a silicon based surface, placing said semiconductor substrate in a heat treatment furnace, said heat treatment furnace comprising an inert gas;

thermally forming an oxide layer on said silicon based substrate, forming an oxidized silicon-based surface;

first annealing said oxidized silicon-based surface by introducing a first annealing agent comprising $H_2$ into said heat treatment furnace while maintaining a first temperature between about 800 and 1200 degrees C. for a first time span of between about 20 and 40 seconds; and second annealing said oxidized silicon-based surface by introducing a second annealing agent comprising $N_2$ into said heat treatment furnace while maintaining said second temperature of between about 800 and 1200 degrees C. during a second time span of between about 20 and 40 seconds; and cooling the oxidized, silicon based surface in the presence of both the inert gas and the first and second annealing agents.

2. The method of claim 1 wherein said thermally forming an oxide layer on said silicon based substrate is:

introducing said substrate into an oxidation chamber; and heating said silicon-based surface at a first temperature in the presence of an oxidizing atmosphere to form an oxide layer over said silicon-based surface.

3. A method for forming a high quality oxide on the surface of a semiconductor substrate, comprising the steps of:

providing a semiconductor substrate said substrate having a silicon-based surface, placing said semiconductor substrate in a heat treatment furnace, said heat treatment furnace comprising an inert gas;

thermally forming an oxide layer on said silicon based surface; and annealing said oxidized silicon based surface in a mixture of hydrogen and nitrogen by exposing said oxidized silicon based surface by introducing an annealing agent comprising a mixture of about equal amounts of $H_2$ and $N_2$ into said CVD reaction chamber, at a temperature between about 850 and 1100 degrees C., for a duration between about 20 and 100 seconds; and cooling said oxidized, silicon based surface in the presence of both said inert gas and said annealing agent.

4. The method of claim 3 wherein said thermally forming an oxide layer on said silicon based surface is:

introducing said substrate into an oxidation chamber; and heating said silicon-based surface at a first temperature in the presence of an oxidizing atmosphere to form an oxide layer over said silicon-based surface.

5. The method of claim 4 wherein said first temperature is between about 750 and 900 degrees C.

6. A method for forming a high quality oxide on the surface of a semiconductor substrate, comprising the steps of:

providing a semiconductor substrate said substrate having a silicon-based surface, placing said semiconductor substrate in a heat treatment furnace, said heat treatment furnace comprising an inert gas;

thermally forming an oxide layer on said silicon based surface;

annealing said oxidized silicon based surface in a hydrogen containing ambient by exposing said oxidized silicon based surface by introducing an annealing agent comprising pure $H_2$ into said CVD reaction chamber at a temperature between about 850 and 1100 degrees C. for a duration between about 20 and 100 seconds; and cooling said oxidized, silicon based surface in the presence of both said inert gas and said annealing agent.

7. The method of claim 6 wherein said thermally forming an oxide layer on said silicon based surface is:

introducing said substrate into an oxidation chamber; and heating said silicon-based surface at a first temperature in the presence of an oxidizing atmosphere to form an oxide layer over said silicon-based surface.

8. The method of claim 7 wherein said first temperature is between about 750 and 900 degrees C.

* * * * *